(12) United States Patent
Araki

(10) Patent No.: US 10,615,032 B2
(45) Date of Patent: Apr. 7, 2020

(54) SEMICONDUCTOR DEVICE MANUFACTURING METHOD

(71) Applicant: KYOCERA Corporation, Kyoto-shi, Kyoto (JP)

(72) Inventor: Masahiro Araki, Kanzaki (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/254,167

(22) Filed: Jan. 22, 2019

(65) Prior Publication Data

US 2019/0237324 A1 Aug. 1, 2019

(30) Foreign Application Priority Data

Jan. 31, 2018 (JP) .................. 2018-015981

(51) Int. Cl.
| | |
|---|---|
| *H01L 21/02* | (2006.01) |
| *H01L 21/033* | (2006.01) |
| *C30B 29/40* | (2006.01) |
| *C30B 25/04* | (2006.01) |
| *C30B 25/18* | (2006.01) |
| *H01L 21/20* | (2006.01) |

(52) U.S. Cl.
CPC .......... *H01L 21/0262* (2013.01); *C30B 25/04* (2013.01); *C30B 25/18* (2013.01); *C30B 29/406* (2013.01); *H01L 21/0254* (2013.01); *H01L 21/02389* (2013.01); *H01L 21/02433* (2013.01); *H01L 21/02458* (2013.01); *H01L 21/02502* (2013.01); *H01L 21/02507* (2013.01); *H01L 21/02576* (2013.01); *H01L 21/02642* (2013.01); *H01L 21/02647* (2013.01); *H01L 21/02664* (2013.01); *H01L 21/0337* (2013.01); *H01L 21/2007* (2013.01); *H01L 21/02579* (2013.01)

(58) Field of Classification Search
CPC ..................................................... H01L 21/02
See application file for complete search history.

(56) References Cited

FOREIGN PATENT DOCUMENTS

JP 5023318 B2 9/2012

*Primary Examiner* — Marvin Payen
(74) *Attorney, Agent, or Firm* — Volpe and Koenig, P.C.

(57) ABSTRACT

A semiconductor device manufacturing method according to the present disclosure includes: preparing a substrate having a surface layer at least made of semiconductor; forming a mask pattern having a plurality of openings on the surface layer using materials free of semiconductor vapor-phase growth; forming a brittle portion in each opening by a vapor-phase growth process; forming crystal growth-derived layer on the mask pattern by a vapor-phase growth process by growth of semiconductor crystals on a surface of the brittle portion ; and separating, at brittle portion, a crystal growth-derived layer from substrate.

7 Claims, 15 Drawing Sheets

SEMICONDUCTOR DEVICE MANUFACTURING METHOD

CROSS-REFERENCE TO RELATED APPLICATION

This application claims priority to Japanese Patent Application No. 2018-015981, which was filed on Jan. 31, 2018, the contents of which are incorporated herein by reference in its entirety.

BACKGROUND OF THE INVENTION

1. Field of the Invention

The present invention relates to a semiconductor device manufacturing method.

2. Description of the Related Art

There is a heretofore known semiconductor device manufacturing method for producing a semiconductor device by forming a semiconductor layer on a substrate by crystal growth, and thereafter separating the semiconductor layer from the substrate (refer to Japanese Examined Patent Publication No. JP-B2 5023318, for example).

SUMMARY OF THE INVENTION

A reduction in deterioration of semiconductor layer quality has been demanded in the process of separating the semiconductor layer from the substrate.

A semiconductor device manufacturing method according to the present disclosure comprises: preparing a substrate having a surface layer; forming a mask pattern having a plurality of openings on the surface layer; forming a semiconductor layer by a vapor-phase growth process by growth of semiconductor crystals from the plurality of openings onto a top of the mask pattern, while forming a brittle portions in the openings; and separating, at the brittle portions, the semiconductor layer from the substrate.

The semiconductor device manufacturing method according to the present disclosure enables smooth separation between a substrate and a crystal growth-derived layer having grown on the substrate, and thus it is possible to reduce deterioration in the characteristics of the crystal growth-derived layer.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
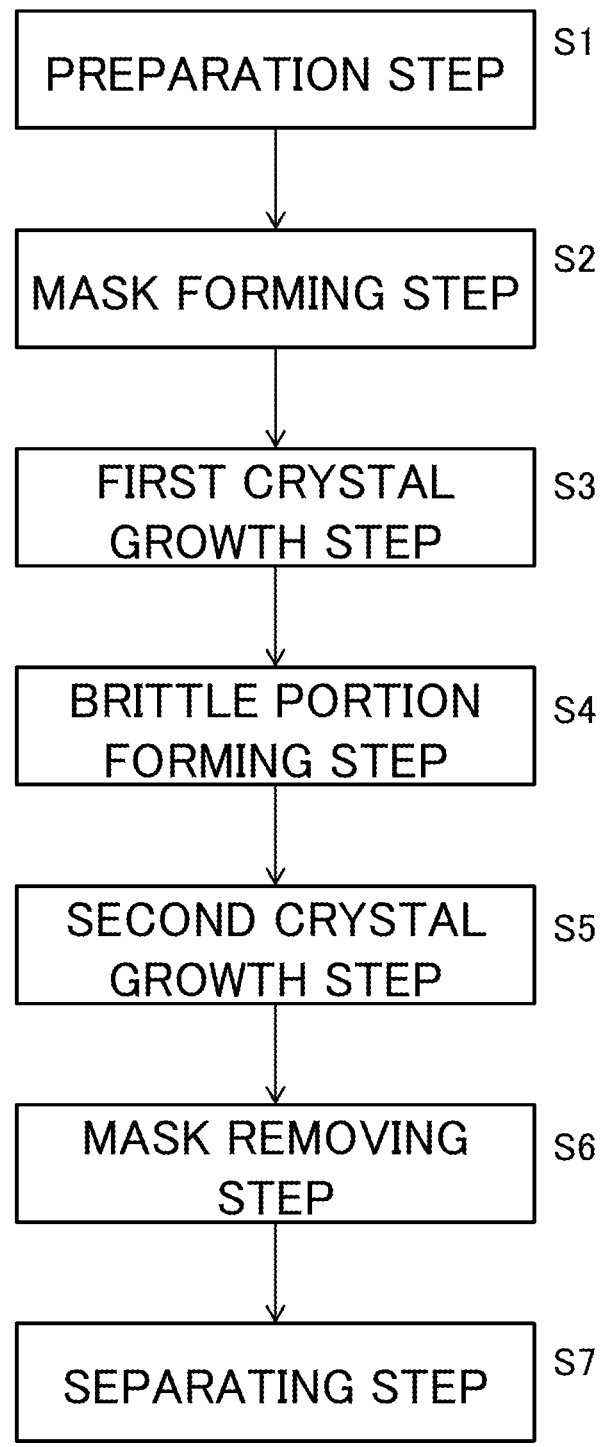
FIG. 1 is a flow chart for a semiconductor device manufacturing method according to the present embodiment.

Now referring to the drawings, preferred embodiments of the invention are described below. FIG. 1 is a flow chart for a semiconductor device manufacturing method according to the present embodiment. The semiconductor device manufacturing method according to the present disclosure comprises: a preparation step S1 of preparing a substrate; a mask forming step S2 of forming a mask pattern on the substrate; a first crystal growth step S3 of causing a semiconductor to grow on the substrate; a brittle portion forming step S4 of forming a brittle portion on a semiconductor layer having grown in the first crystal growth step; a second crystal growth step S5 of causing a semiconductor layer to grow on a surface of the brittle portion serving as a growth onset area; a mask removing step S6 of removing the mask pattern formed on the substrate by etching; and a separating step S7 of separating the semiconductor layer from the substrate. As employed herein "nitride semiconductor" refers to, for example, a semiconductor formed of $Al_xGa_yIn_zN$ (wherein $0 \le x \le 1$; $0 \le y \le 1$; $0 \le z \le 1$; $x+y+z=1$).

(1) Preparation Step S1

Figure 2:
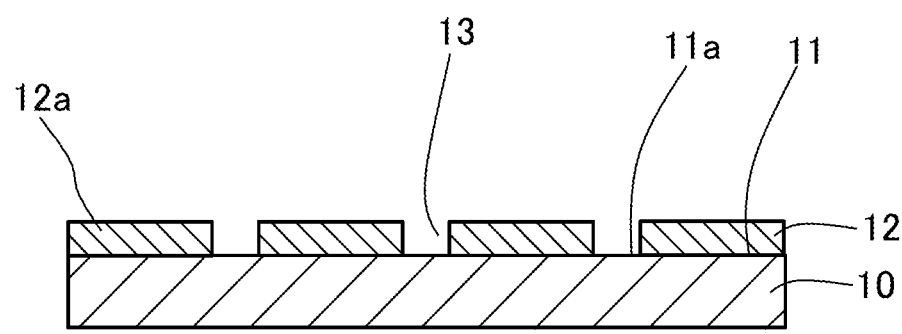
FIG. 2 is a sectional view showing the semiconductor device manufacturing method according to the present embodiment.
Figure 2:
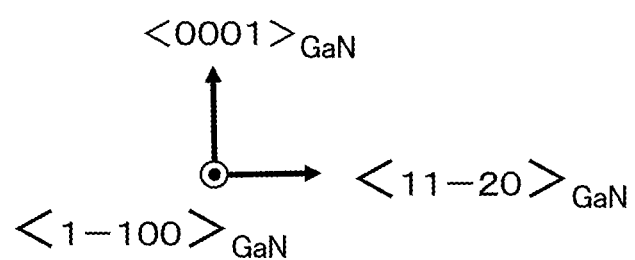
Figure 3:
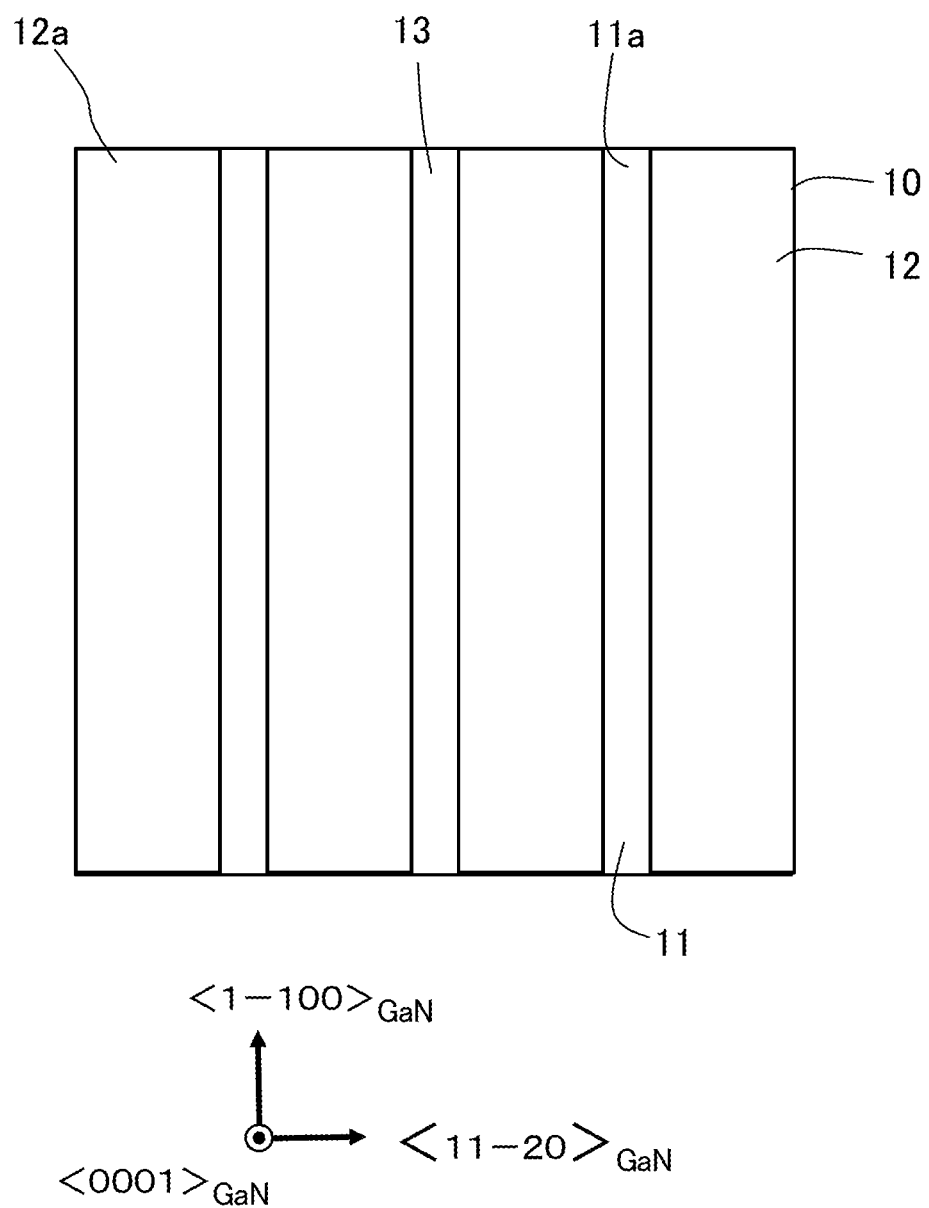
FIG. 3 is a plan view showing the semiconductor device manufacturing method according to the present embodiment.

FIG. 2 is a sectional view showing the semiconductor device manufacturing method according to the present embodiment. Moreover, FIG. 3 is a plan view showing the semiconductor device manufacturing method according to the present embodiment. A substrate 10 having a surface layer 11 is prepared first. For example, the substrate 10 may be built as a nitride semiconductor substrate. As the substrate 10 according to the present disclosure, for example, it is possible to use a GaN substrate cut from a gallium nitride (GaN) single crystal ingot. Alternatively, the substrate 10 may be built as an n-type or p-type substrate made of a semiconductor doped with impurities. For example, a substrate having an impurity concentration in the order of about $1 \times 10^{19}$ $cm^{-3}$ or less may be used.

Moreover, as the substrate 10, it is possible to use can other substrate than a GaN substrate, for example, a sapphire substrate or a SiC substrate with a GaN layer formed on a surface thereof. Note that the surface layer 11 of the substrate 10 is not limited to a GaN layer, but may be any layer made of a nitride semiconductor.

With regard to crystal plane orientation of a semiconductor with respect to the normal to the substrate 10, crystal planes such as C-plane (0001) which is a polar plane, A-plane (11-20) and M-plane (1-100) that are each a nonpolar plane, and R-plane (1-102), (11-20), and (20-21) which is a semi-polar plane may be used. The crystal plane may be appropriately selected according to the type of a device which is formed on the substrate 10. Moreover, it is possible to use a substrate having an off-angled plane inclined at several degrees with respect to the aforenamed crystal planes, being called an off-angle substrate.

(2) Mask Forming Step S2

Next, a mask pattern 12 is formed on the substrate 10 prepared as a GaN substrate in the above-described preparation step. At the outset, as the material of formation of the mask pattern 12, silicon oxide ($SiO_2$) is deposited on the substrate 10 by means of PCVD (Plasma Chemical Vapor Deposition) or otherwise to form a $SiO_2$ layer having a thickness of about 100 nm to 500 nm on the surface layer 11. Then, the $SiO_2$ layer is subjected to patterning using photolithography and HF (hydrogen fluoride) wet etching or dry etching using fluorine gas such as $CF_4$ to form the mask pattern 12 having openings 13. For example, as shown in FIG. 2, the mask pattern 12 includes a plurality of strip bodies 12a arranged parallel to one another. In this case, a gap between adjacent strip bodies 12a defines the opening 13. The opening 13 has a strip-like form. For example, the strip body 12a has a width of 150 µm to 200 µm, whereas the opening 13 has a width of 2 µm to 20 µm.

While the mask pattern 12 covers the surface layer 11, a part of the surface layer 11 which corresponds to the opening 13 is exposed. That is, on the substrate 11, there are provided growth regions 11a each defined by the exposed part of the surface layer 11. The growth region 11a is a region where the semiconductor of the surface layer 11 of the substrate 10 is exposed. In the subsequent first crystal growth step S3, the growth region 11a undergoes semiconductor crystal growth.

For example, where a semiconductor substrate of <0001>-oriented GaN is used as the substrate 10, as shown in FIG. 3, the substrate may be formed with a mask pattern defined by a plurality of strip bodies 12a regularly spaced apart at a pitch of 150 to 200 µm in a first direction parallel to the <11-20> direction of GaN, each strip body extending in a second direction parallel to the <1-100> direction of GaN of the semiconductor substrate. For example, the strip body 12a has a width of 150 µm to 200 µm, whereas the opening 13 has a width of 2 µm to 20 µm.

A first semiconductor layer 14 obtained by carrying out crystal growth on the growth region 11a as described above is suitable for use in the production of a semiconductor laser device. For example, each of the strip body 12a and the opening 13 of the mask pattern 12 is formed so that a longitudinal direction thereof is aligned with the direction of the M-axis <1-100> of GaN, and accordingly a cleaved surface corresponds to the M-plane. Thus, the longitudinal direction of the mask pattern 12 may be defined as the longitudinal direction of the semiconductor laser device.

The relationship between the width of the strip body 12a and the width of the opening 13 may be determined in consideration of the ratio of a crystal growth rate in a semiconductor layer, which is formed in the second crystal growth step S5 as described later, in a direction perpendicular to the plane of the substrate 10 to a crystal growth rate in the semiconductor layer in a direction parallel to the plane of the substrate 10, and also the thickness of a grown semiconductor layer.

As a mask-forming material for forming the mask pattern 12, it is possible to use, in addition to $SiO_2$, any material as long as a semiconductor layer does not grow on a surface of the mask-forming material as a growth onset area by vapor phase epitaxy, for example, patterning-capable oxide such as zirconium oxide (ZrOx), titanium oxide (TiOx), and aluminum oxide (AlOx), and transition metal such as tungsten (W) and chromium (Cr). Moreover, the layer of the mask-forming material may be formed by any depositing method suited to the mask-forming material, such as vapor deposition, sputtering, or a coating-curing technique.

Figure 4:
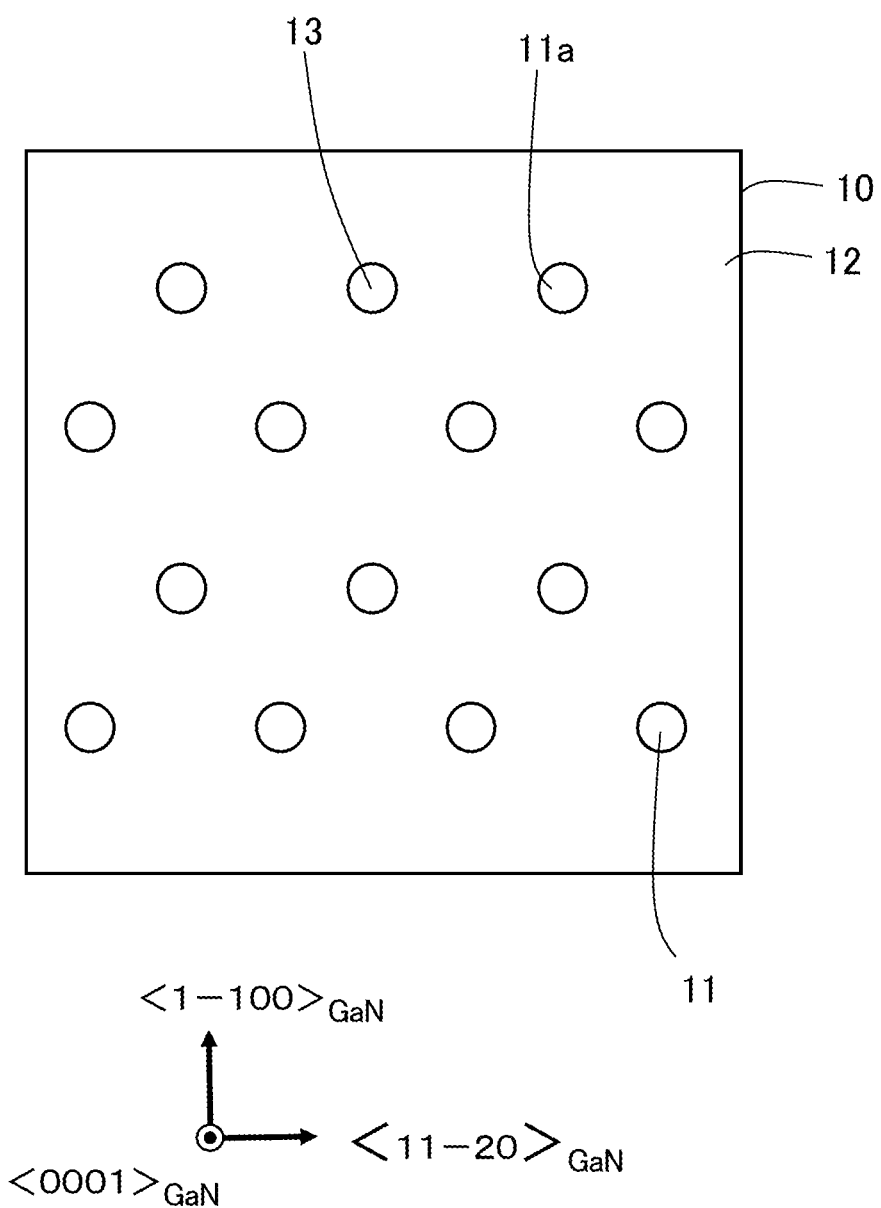
FIG. 4 is a plan view showing another example of the mask pattern.

FIG. 4 is a plan view showing another example of the mask pattern 12 which is formed in the mask forming step. In this example, the openings 13 each in the form of a circular dot are disposed away from each other at predetermined intervals so that the nearest-neighboring openings are disposed in an equilateral-triangular arrangement. In the mask pattern as seen in a plan view, a single opening 13 has a diameter of about 2 µm to 20 µm, and the distance between the single opening 13 and the opening 13 adjacent to it falls in a range of about 150 µm to 200 µm. The relationship between a distance between the adjacent openings 13 and the radius of the circular dot-shaped opening 13 may be determined in consideration of the ratio of a crystal growth rate in a semiconductor layer, which is formed in the second crystal growth step S5 as described later, in a direction perpendicular to the plane of the semiconductor layer, to a crystal growth rate in the semiconductor layer in a direction parallel to the plane, and also the thickness of a grown semiconductor layer.

(3) First Crystal Growth Step S3

Figure 5:
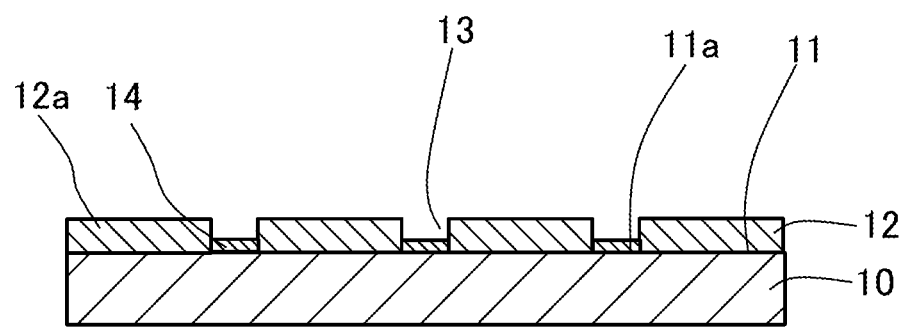
FIG. 5 is a sectional view showing the semiconductor device manufacturing method according to the present embodiment.
Figure 5:
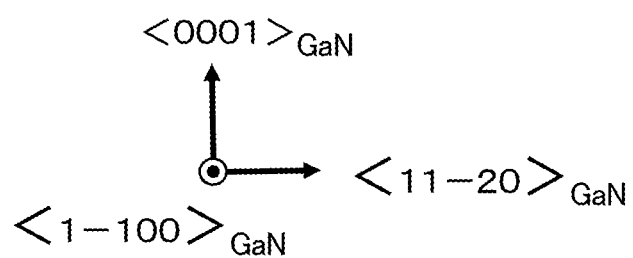

FIG. 5 is a sectional view showing the semiconductor device manufacturing method according to the present embodiment. In the first crystal growth step S3, the semiconductor-made first semiconductor layer 14 is formed on the growth region 11a by a vapor-phase growth process (epitaxial growth). The first semiconductor layer 14 of the present disclosure is made of a nitride semiconductor.

Examples of the vapor-phase growth process applicable to the first crystal growth step S3 include HVPE (Hydride Vapor Phase Epitaxy) using chloride as a Group III-based raw material, MOCVD (Metal Organic Chemical Vapor Deposition) using an organic metal as a Group III-based raw material, and MBE (Molecular Beam Epitaxy).

For example, in the case of causing a GaN layer serving as the first semiconductor layer 14 to grow on the growth region 11a by MOCVD, the substrate 10 formed with the mask pattern 12 is inserted in a reaction tube of an epitaxial growth apparatus, and, under the supply of a hydrogen gas, a nitrogen gas or a gas mixture of hydrogen and nitrogen, and a Group V-based raw material gas such as ammonia, the temperature of the substrate 10 is raised to a predetermined growth temperature (for example, from 1050° C. to 1100° C.). After temperature stabilization, in addition to the aforenamed gases, a Group III-based raw material gas such as trimethyl gallium (TMG) is supplied to cause the semiconductor layer 14 to grow from the growth region 11a by the vapor-phase growth process. At this time, by supplying a raw material gas of impurities, for example, n-type impurities such as Si or p-type impurities such as Mg, it is possible to obtain a GaN layer of desired conductive type. At this time, the growth of crystal does not occur on the mask pattern 12.

The first semiconductor layer 14 is formed inside the opening 13 by the vapor-phase growth process. The first crystal growth step S3 is terminated under a condition where the surface of the grown first semiconductor layer 14 is located in the opening 13, and the procedure proceeds to the brittle portion forming step S4. That is, a thickness of the first semiconductor layer 14 is smaller than a thickness of the mask pattern 12.

(4) Brittle Portion Forming Step S4

Figure 6:
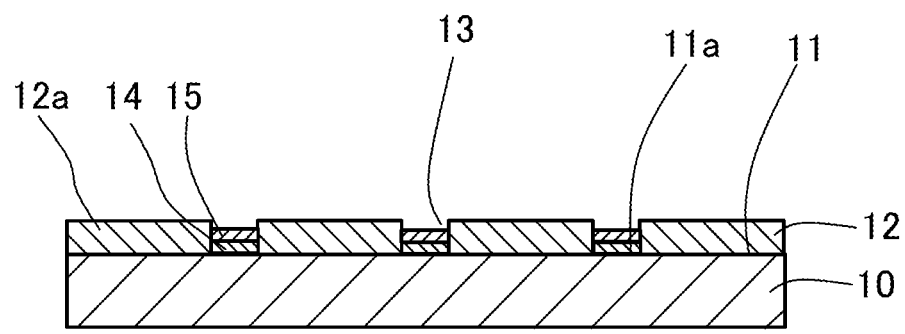
FIG. 6 is a sectional view showing the semiconductor device manufacturing method according to the present embodiment.
Figure 6:
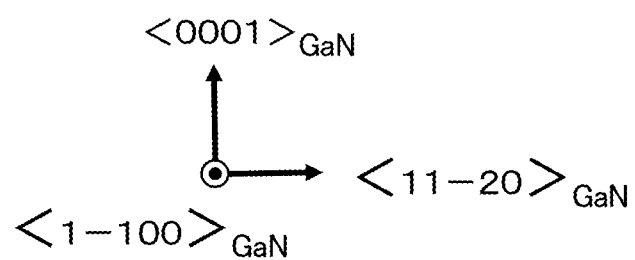

FIG. 6 is a sectional view showing the semiconductor device manufacturing method according to the present embodiment. The brittle portion forming step S4 may be continuously performed subsequent to the first crystal growth step S3. The surface of the first semiconductor layer 14 is located in the opening 13. A brittle portion 15 is caused to grow on the first semiconductor layer 14 by varying conditions of the vapor-phase growth process. For example, the brittle portion 15 has a layer thickness of about 2 nm to 100 nm. The brittle portion 15 is formed so as to extend along the surface of the substrate. The following describes a plurality of examples of the form of the brittle portion 15.

EXAMPLE 1

The brittle portion 15 can be obtained by forming a crystal growth-derived layer that differs in composition from the crystal growth-derived layer formed in the first crystal growth step S3. For example, where a GaN layer is formed by crystal growth in the first crystal growth step S3, the brittle portion 15 may be formed by causing a GaN-based mixed crystal such as a crystal mixture of GaN and BN, a crystal mixture of GaN and AlN, or a crystal mixture of GaN and InN to grow.

For example, where the first semiconductor layer 14 having grown in the first crystal growth step S3 is a GaN layer, on the first semiconductor layer 14, the brittle portion 15 is formed of $Al_xGa_yIn_zN$ (wherein $0 \leq x \leq 1$; $0y<1$; $0 \leq z \leq 1$; $x+y+z=1$). Due to the difference in lattice constant between the crystal growth-derived layer and the brittle portion 15, at the time of separation from the substrate in the separating step S7 as described later, stress concentration occurs around the brittle portion 15, and as a result, it is possible to create the trigger of cracks.

EXAMPLE 2

Figure 7:
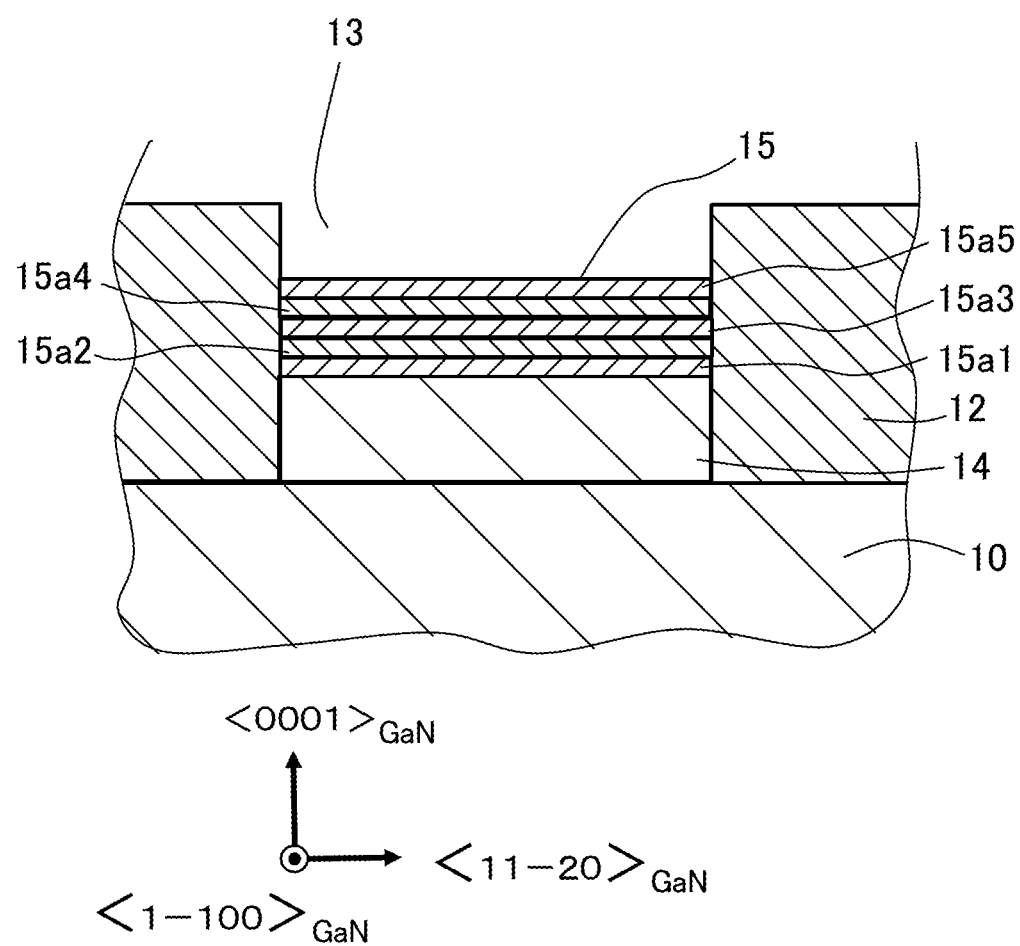
FIG. 7 is an enlarged sectional view showing the semiconductor device manufacturing method according to the present embodiment.

The brittle portion 15 may be configured to have a multilayer structure including a plurality of layers laminated so that layers having different compositions are adjacent to each other. FIG. 7 is an enlarged sectional view showing the semiconductor device manufacturing method according to the present embodiment. On the first semiconductor layer 14 having grown as a GaN layer in the first crystal growth step S3, an AlGan layer 15a1 is caused to grow by the vapor-phase growth process in a thickness of about 2 to 20 nm. Next, on the AlGan layer 15a1, a Gan layer 15a2 is caused to grow by the vapor-phase growth process in a thickness of about 2 to 20 nm. By repeating these processes, AlGan layers 15a1, 15a3, and 15a5 and Gan layers 15a2 and 15a4 are alternately laminated in a total thickness of 10 to 100 nm to form the brittle portion 15 having a superlattice structure. With the brittle portion 15 of superlattice structure, stress concentration occurs around the brittle portion 15, and as a result, it is possible to create the trigger of cracks more readily, and the separating step S7 can be easily carried out. Moreover, in the layered structure, separable surface and interfaces can be easily formed along the surface of the substrate, and thus the separating step S7 can be accomplished with greater stability.

EXAMPLE 3

Figure 8:
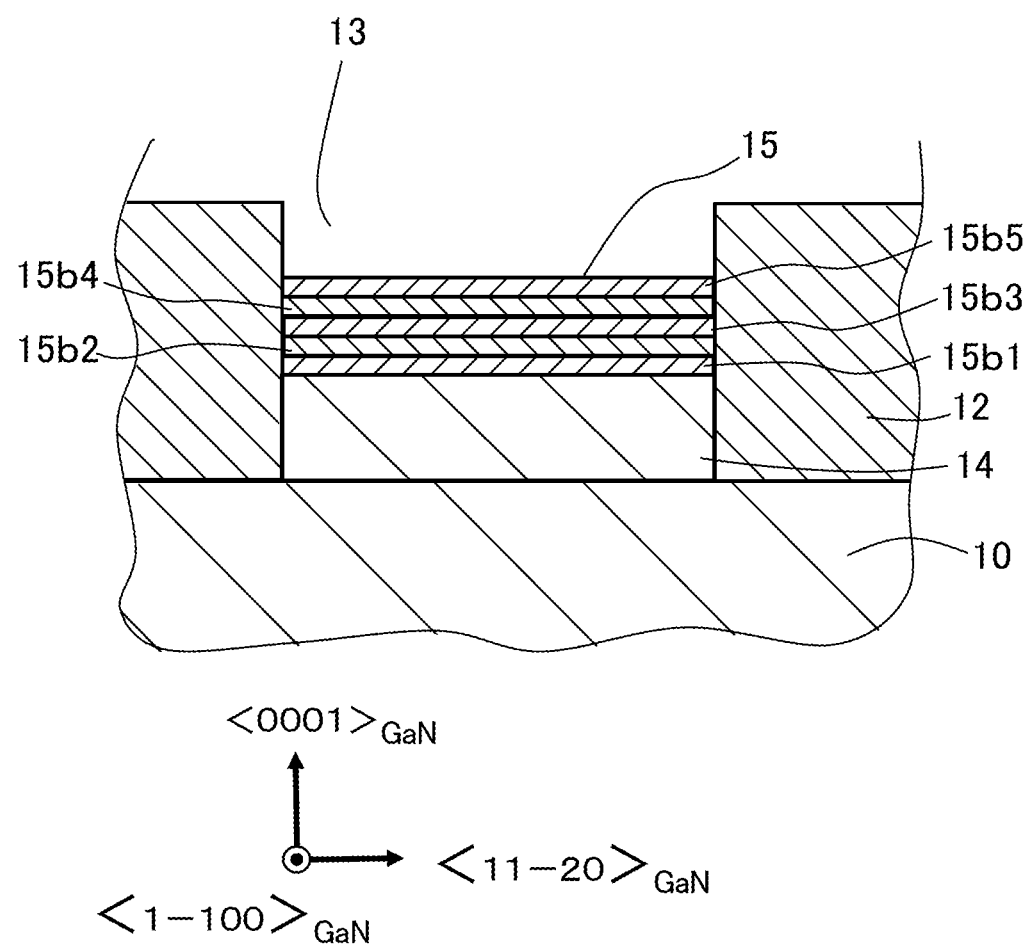
FIG. 8 is an enlarged sectional view showing the semiconductor device manufacturing method according to the present embodiment.

The brittle portion 15 may be configured to have a multilayer structure including layers that, while being made of substances having the same composition, have been caused to grow differently by periodically varying the conditions of layer growth. For example, the brittle portion 15 can be formed by varying the temperature of the substrate 10 during crystal growth. FIG. 8 is an enlarged sectional view showing the semiconductor device manufacturing method according to the present embodiment. Following the completion of the first crystal growth step S3, the temperature of the substrate is lowered to 700° C. to cause a semiconductor layer 15b1 to grow to a thickness of about 2 to 20 nm, wherein the semiconductor layer 15b1 is lower in crystal surface roughness than the layer having grown at higher temperature. Then, the temperature of the substrate is raised to 1070° C. to cause a semiconductor layer 15b2 to grow to a thickness of about 2 to 20 nm, wherein the semiconductor layer 15b2 is higher in crystal surface roughness than the semiconductor layer 15b1. By repeating these processes, on the first semiconductor layer 14, semiconductor layers 15b1, 15b3, and 15b5 having lower surface roughness and semiconductor layers 15b2 and 15b4 having higher surface roughness are alternately laminated in a total thickness of 10 to 100 nm to form the brittle portion 15. At this time, the temperature of the substrate may be periodically varied concurrently with the supply of raw material gases. Moreover, the semiconductor layers 15b1, 15b3, and 15b5 having lower surface roughness may be made as amorphous semiconductor layers.

In the brittle portion 15 thereby formed under conditions where the temperature of the substrate is raised and lowered repeatedly, there is provided a periodic structure including the alternately laminated low-crystallinity semiconductor layers 15b1, 15b3, and 15b5 having smaller crystal grain size and high-crystallinity semiconductor layers 15b2 and 15b4 having larger crystal grain size. Thus, at the time of separating the crystal growth-derived layer from the substrate 10 following the completion of the second crystal growth step as later described, stress concentration occurs around the brittle portion 15, as a result, it is possible to create the trigger of cracks, and this enables easy separation of the crystal growth-derived layer from the substrate 10. Moreover, in the periodic structure, separable surface and interfaces can be easily formed along the surface of the substrate 10, and thus the separating step S7 can be accomplished with greater stability.

EXAMPLE 4

The brittle portion 15 of multilayer structure can be formed by periodically varying the concentration of impurities to be contained in each layer. In the formation of the brittle portion 15, it is possible to use a semiconductor which differs in impurity concentration from the first semiconductor layer 14. For example, the brittle portion 15 can be formed by varying the concentration of silicon (Si), which is used as an N-type impurities in GaN.

Figure 9:
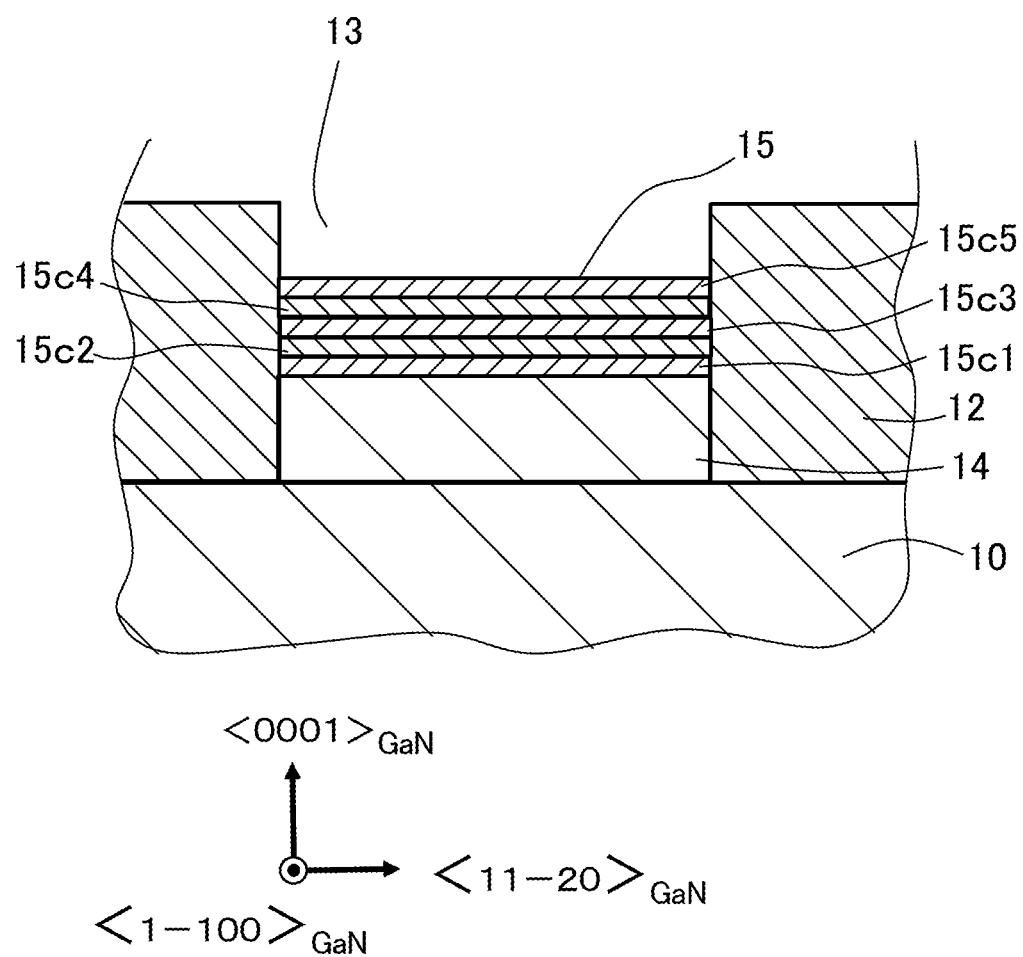
FIG. 9 is an enlarged sectional view showing the semiconductor device manufacturing method according to the present embodiment.

FIG. 9 is an enlarged sectional view showing the semiconductor device manufacturing method according to the present embodiment. A crystal growth-derived GaN layer is formed in the first crystal growth step, and, under the supply of silane diluted with nitrogen gas (SiH4) as a raw material gas of n-type impurities, a crystal growth-derived layer having a Si concentration in the order of $1\times10^{19}$ cm$^{-3}$ is caused to grow to a thickness of about 2 to 20 nm. Then, the concentration of SiH4 to be supplied is lowered to cause a crystal growth-derived layer having a Si concentration in the order of $1\times10^{16}$ cm$^{-3}$ to grow to a thickness of about 2 to 20 nm. By repeating these processes, semiconductor layers 15c1, 15c3, and 15c5 containing impurities at higher concentration and semiconductor layers 15c2 and 15c4 containing impurities at lower concentration are alternately laminated in a total thickness of 10 to 100 nm to form the brittle portion 15.

With a stack of layers having different impurity concentrations, stress concentration occurs around the brittle portion 15, as a result, it is possible to create the trigger of cracks in a direction along the substrate 10 of the brittle portion 15, and this enables easy separation of the crystal growth-derived layer from the substrate 10. Moreover, in the periodic structure, separable surface and interfaces can be easily formed along the plane of the substrate 10, and thus the separating step S7 can be accomplished with greater stability.

(5) Second Crystal Growth Step S5

Figure 10:
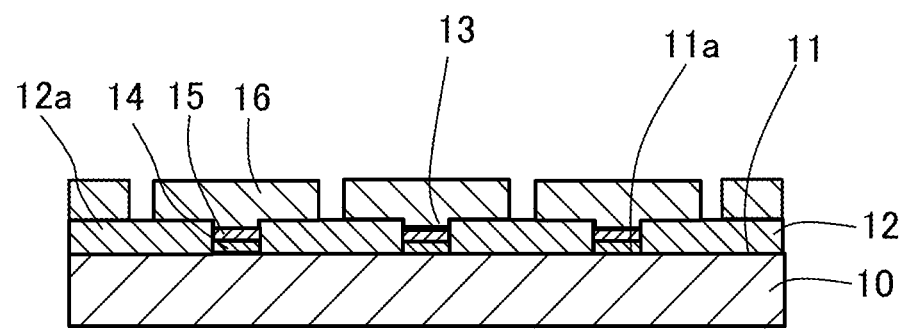
FIG. 10 is a sectional view showing the semiconductor device manufacturing method according to the present embodiment.
Figure 10:
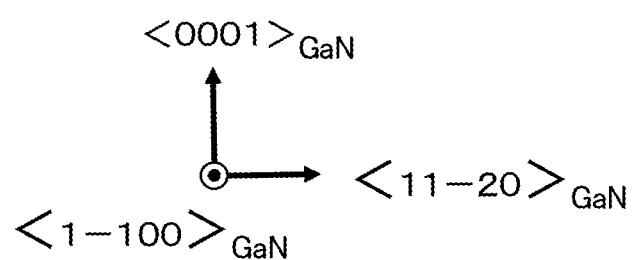

FIG. 10 is a sectional view showing the semiconductor device manufacturing method according to the present embodiment. In this step, GaN is caused to grow on a surface of the brittle portion 15 serving as a growth onset area by the vapor-phase growth process to cause a second semiconductor layer 16 to grow from each brittle portion 15. The second semiconductor layer 16 grows over the top face of the mask pattern 12. Upon the plane of the crystal growth-derived layer reaching a level above the top face of the mask pattern 12, the layer further grows in a direction perpendicular to the surface of the substrate 10, and also grows along the top face of the mask pattern 12 transversely. The second semiconductor layer 16 of the present disclosure is made of a nitride semiconductor.

For example, in the case of causing a GaN layer as the second semiconductor layer 16 to grow on the brittle portion 15 by MOCVD, following the completion of the brittle portion forming step S4, in an epitaxial growth apparatus, the temperature of the substrate 10 is adjusted to a predetermined growth temperature (for example, from 1000° C. to 1100° C.) under the supply of a hydrogen gas, a nitrogen gas or a gas mixture of hydrogen and nitrogen, and a Group V-based raw material gas such as ammonia. After the temperature stabilization, in addition to the aforenamed gases, a Group III-based raw gaseous material such as trimethyl gallium (TMG) is supplied to cause the second semiconductor layer 16 to grow from the surface of the brittle portion 15 by the vapor-phase growth process. At this time, by supplying a raw material gas of impurities, for example, n-type impurities such as Si or p-type impurities such as Mg, it is possible to obtain a GaN layer of desired conductive type.

The second semiconductor layer 16 starts to grow from the surface of the brittle portion 15, and, after the plane of the crystal growth-derived layer reaches a level above the height of the mask pattern 12, the second semiconductor layer 16 further grows along the top face of the mask pattern 12 transversely. The second semiconductor layer 16 thus formed suffers little from threading dislocations, and this makes it possible to obtain a crystal growth-derived layer which lends itself to the production of laser devices, etc.

Figure 11:
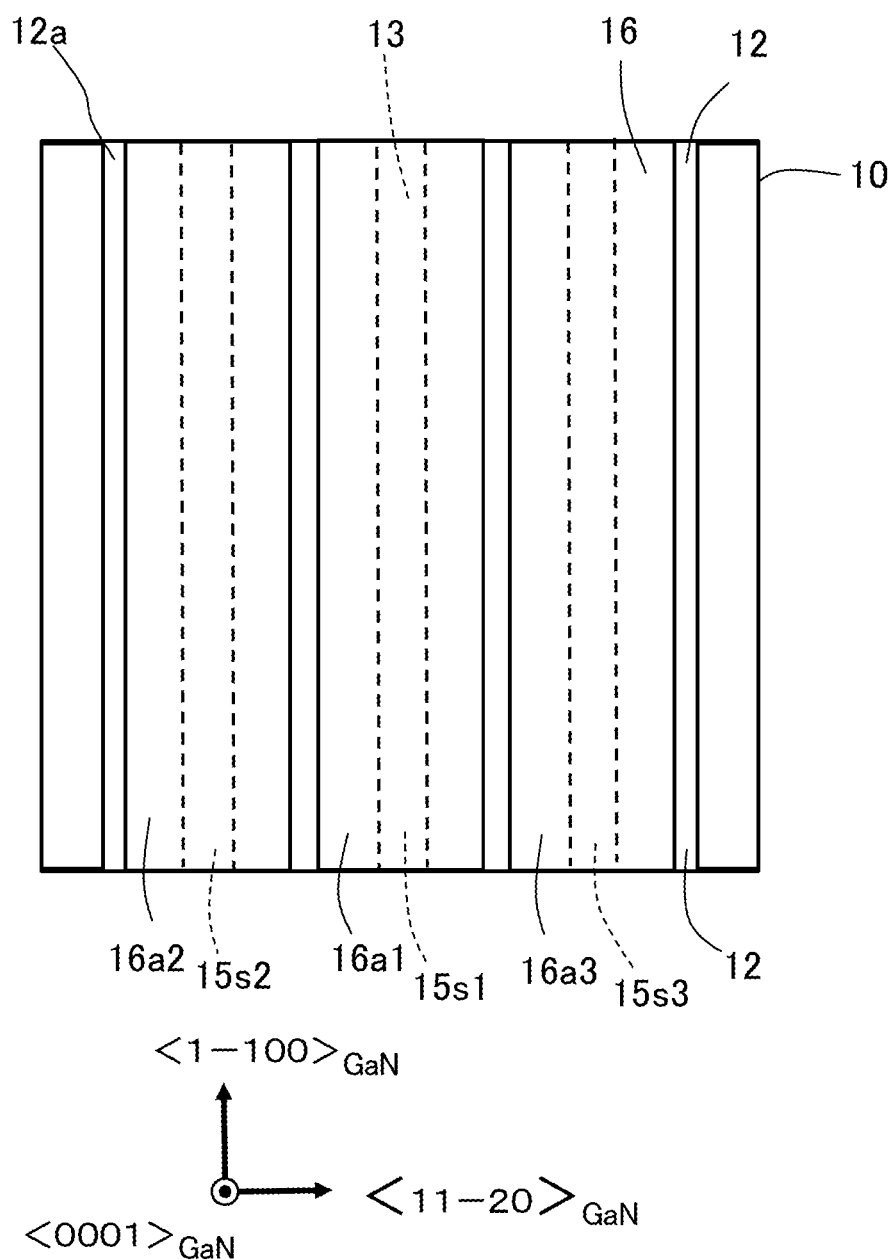
FIG. 11 is a plan view showing the semiconductor device manufacturing method according to the present embodiment.

FIG. 11 is a plan view showing the semiconductor device manufacturing method according to the present embodiment. The second crystal growth step S5 is terminated before the adjacent second semiconductor layers 16 having grown from their respective brittle portions 15 do not overlap one another. For example, the second crystal growth step S5 is terminated in a state where a second semiconductor layer 16a1 having grown from a brittle portion surface 15s1 does not overlap adjacent second semiconductor layers 16a2 and 16a3 having grown from brittle portion surfaces 15s2 and 15s3, respectively. That is, the crystal growth is stopped in a state where the second semiconductor layer 16a1 having grown from one brittle portion surface 15s1 and the second semiconductor layers 16a2 and 16a3 having grown from the other brittle portion surfaces 15s2 and 15s3, all of which brittle portion surfaces are disposed adjacent to each other via the strip bodies 12a, are disposed away from each other, and the crystal growth step is terminated.

When the substrate 10 is seen in a plan view from above following the completion of the second crystal growth step S5, the second semiconductor layer 16a1 is disposed away from the second semiconductor layers 16a2 and 16a3, and, at a location near each edge of the second semiconductor layer 16, the strip body 12a is exposed. If the adjacent second semiconductor layers 16 are in contact with each other at their edges, a part of the second semiconductor layer 16 close to the contiguous edge will be prone to crystal defects such as cracks or threading dislocations. However, since the adjacent second semiconductor layers 16 are disposed away from each other, it is possible to reduce cracks and crystal defects at the edges of the second semiconductor layers 16.

Following the completion of the second crystal growth step S5, the mask removing step S6 is performed as described later. As an alternative, following the completion of the second crystal growth step S5, a semiconductor, an electrode, etc. may be formed on the second semiconductor layer 16, and thereafter the mask removing step S6 may be carried out.

(6) Mask Removing Step S6

Figure 12:
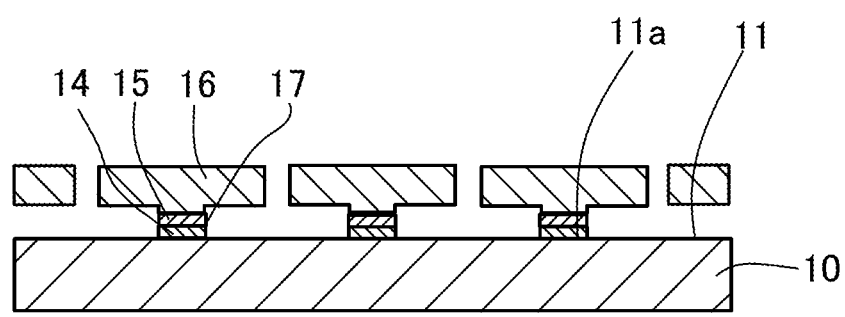
FIG. 12 is a sectional view showing the semiconductor device manufacturing method according to the present embodiment.

FIG. 12 is a sectional view showing the semiconductor device manufacturing method according to the present embodiment. Following the completion of the second crystal growth step S5, the substrate 10 is taken out of the epitaxial growth apparatus, and, the mask-forming material is removed by etching using an etchant which does not essentially affect the grown second semiconductor layer 16. In the case of the mask formed of $SiO_2$, HF wet etching is performed. The mask pattern 12 is removed by the mask removing step S6, and the substrate 10 and the semiconductor layer 16 are only connected by a connection portion 17 which is a slim semiconductor portion formed in the opening 13. Therefore, the separating step S7 as described later can be carried out smoothly.

At this time, the adjacent second semiconductor layers 16 are disposed away from each other as seen in a plan view. Accordingly, in the mask removing step S6, an etching solution reaches the mask pattern 12 swiftly through the gap between the adjacent second semiconductor layers 16, and therefore the mask removing step S6 can be swiftly carried out. Following the completion of the second crystal growth step S5, the separating step S7 can be carried out without the mask removing step S6.

(7) Separating Step S7

Figure 13:
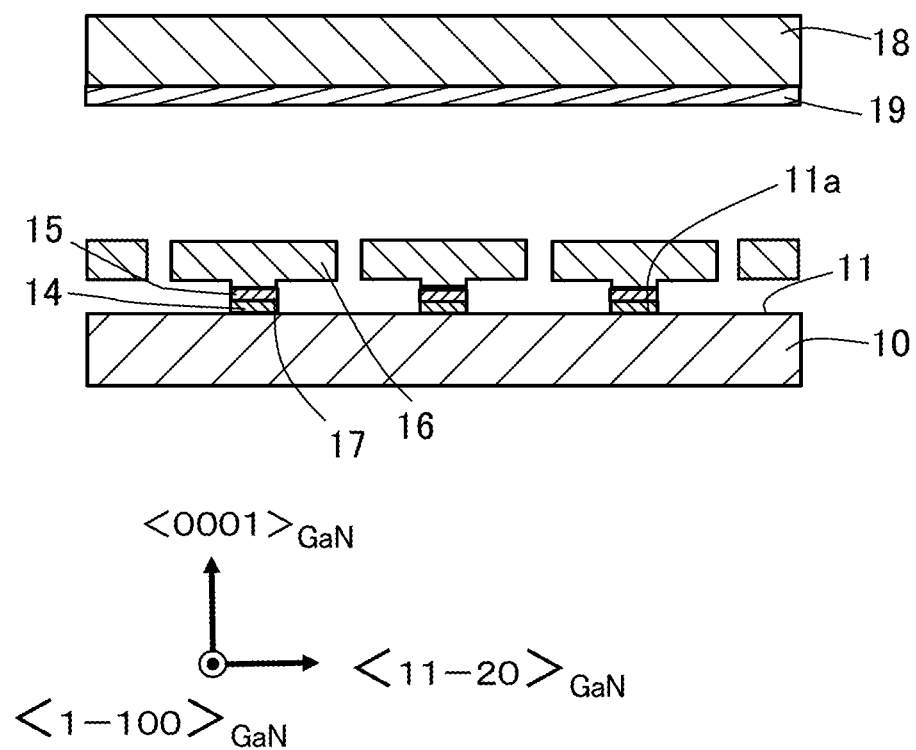
FIG. 13 is a sectional view showing the semiconductor device manufacturing method according to the present embodiment.
Figure 14:
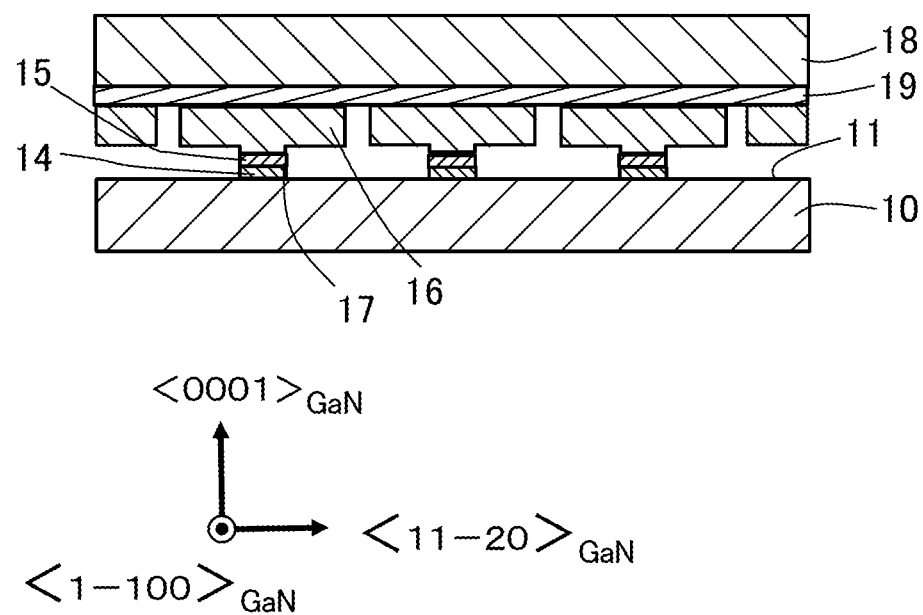
FIG. 14 is a sectional view showing the semiconductor device manufacturing method according to the present embodiment.
Figure 15:
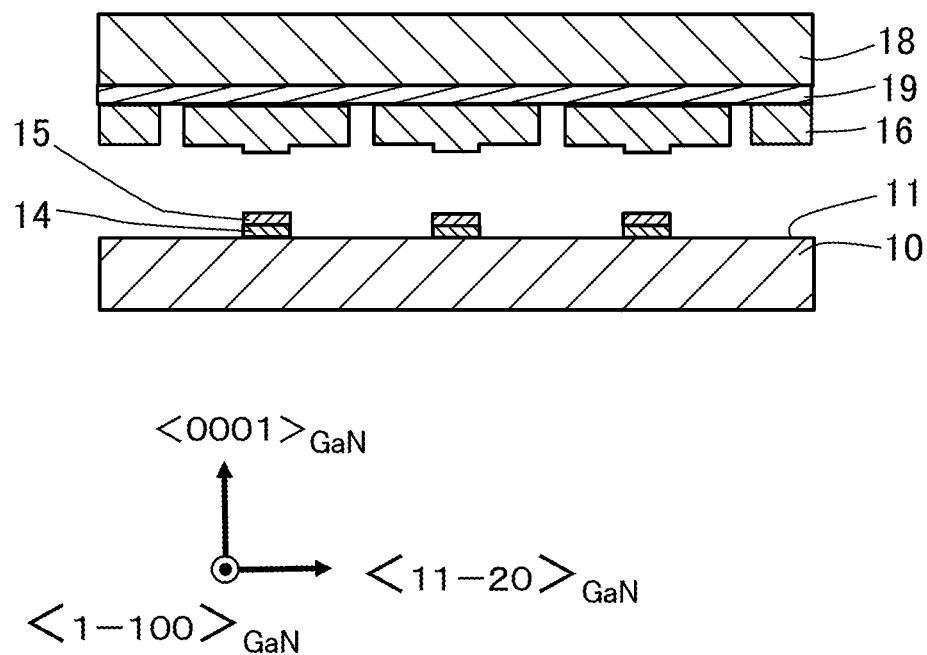
FIG. 15 is a sectional view showing the semiconductor device manufacturing method according to the present embodiment.

FIGS. 13 to 15 are sectional views showing the semiconductor device manufacturing method according to the present embodiment. Following the completion of the mask removing step S6, as shown in FIG. 13, a support substrate 18 formed on one surface with an adhesive layer 19 faces a second semiconductor layer 16-bearing surface of the substrate 10. For example, a thermoplastic resin may be used for the adhesive layer 19. A Si substrate may be used for the support substrate 18. Instead of the Si substrate, a compound semiconductor substrate such as a GaAs substrate, a GaP substrate, or a GaN substrate, a metallic substrate, a ceramic substrate, a carbon substrate, or a resin substrate may be used. Moreover, as the support substrate 18, it is possible to use an adhesive-coated resin-made sheet made as a single sheet, or the aforenamed substrate with an adhesive-coated resin-made sheet carried and supported thereon.

Then, as shown in FIG. 14, the adhesive layer 19 lying on the support substrate 18 is pressed against the second semiconductor layer 16-bearing surface of the substrate 10 to join the substrate 10 and the support substrate 18. At this time, where a thermoplastic resin is used for the adhesive layer 19, after the temperature of the substrate is raised to the softening point of the resin, the support substrate 18 is joined to the substrate 10. This enables the substrate 10 and the support substrate 18 to be joined to each other without fail.

Next, as shown in FIG. 15, an external force is applied to separate the substrate 10 and the support substrate 18 which are integrally joined. At this time, stress concentration occurs around the brittle portion 15, and the trigger of cracks occurs. In consequence, the second semiconductor layer 16 joined to the support substrate 18 is separated from the substrate 10 at the brittle portion 15. That is, in the separating step S7, the substrate 10 and the second semiconductor layer 16 are separated from each other at the brittle portion 15. Although the brittle portion 15 is connected to the first semiconductor layer 14 and is yet separated from the second semiconductor layer 16 in FIG. 15, following the completion of the separating step S7, the brittle portion 15 may be located on either one or both of the substrate 10 and the second semiconductor layer 16. The substrate 10 may be reused after the removal of the first semiconductor layer 14 and the brittle portion 15 by grinding process.

Since the trigger of cracks occurs near the brittle portion 15, the substrate 10 and the second semiconductor layer 16 can be separated from each other at the brittle portion 15 without fail. Since it is difficult for the second semiconductor layer 16 to be affected by the separating step S7, the cracks and the like are less likely to occur in the second semiconductor layer 16 by the separating step S7, and the quality of the second semiconductor layer 16 can be improved.

At this time, when a thickness of the brittle portion 15 is too large, the possibility of cracking in the thickness direction of the brittle portion 15, so that there is a high possibility that defects such as cracks is generated in the second semiconductor layer 16 in the separating step S7. Therefore, by setting the thickness of the brittle portion 15 to 10 nm to 100 nm, the possibility of cracking in the thickness direction of the brittle portion 15 can be reduced, so that the quality of the second semiconductor layer 16 can be improved.

By providing the brittle portion 15 with a superlattice structure, a periodic structure in which high-crystallinity layers and low-crystallinity layers are alternately laminated, or a periodic structure in which high-impurity-concentration layers and low-impurity-concentration layers are alternately laminated, the brittle portion 15 has a multilayer structure, cracks easily occur in the direction along the brittle portion 15, and the possibility of cracking in the thickness direction of the brittle portion 15 can be reduced, so that the quality of the second semiconductor layer 16 can be improved.

MODIFIED EXAMPLE

While the separating step S7 is carried out subsequent to the mask removing step S6 in the semiconductor device manufacturing method described above, the mask removing step S6 may be omitted. Even in this case, stress concentration occurs near the brittle portion 15 and the trigger of cracks occurs, so that the substrate 10 and the second semiconductor layer 16 can be separated from each other at the brittle portion 15 without fail. Moreover, since it is difficult for the second semiconductor layer 16 to be affected by the separating step S7, the cracks and the like are less likely to occur in the second semiconductor layer 16 by the separating step S7, and the quality of the second semiconductor layer 16 can be improved.

It is also possible to carry out the brittle portion forming step S4 following the completion of the mask forming step S2 without carrying out the earlier described first crystal growth step S3. In the case of omitting the first crystal growth step S3, the brittle portion forming step S4 is carried out immediately after the mask forming step S2 of forming the brittle portion 15 directly on the growth region 11a.

Even in the case of omitting the first crystal growth step S3, the substrate 10 and the second semiconductor layer 16 can be separated from each other at the brittle portion 15, in the above-described separating step S7. However, as in the above-described embodiment, it is preferable that the brittle portion forming step S4 is carried out following the completion the first crystal growth step S3. In this case, by forming the first semiconductor layer 14 in the first crystal growth step S3, the brittle portion 15 can be formed in a portion located away from the substrate 10, so that the trigger of cracks is likely to occur in the brittle portion 15, and the substrate 10 and the second semiconductor layer 16 can be separated from each other without fail. Moreover, since the brittle portion 15 is separated from the substrate 10, the possibility of damaging the substrate 10 by the separating step S7 is reduced, abrasion of the substrate 10 is reduced, and therefore cost reduction can be achieved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor device manufacturing method, comprising:
   preparing a substrate having a surface layer;
   forming a mask pattern having a plurality of openings on the surface layer;
   forming a semiconductor layer by a vapor-phase growth process by growth of semiconductor crystals from the plurality of openings onto a top of the mask pattern, while forming a brittle portions in the openings; and
   separating, at the brittle portions, the semiconductor layer from the substrate.

2. The semiconductor device manufacturing method according to claim 1, further comprising:
   removing the mask pattern by etching, wherein the mask pattern is removed after forming the semiconductor layer and before separating the semiconductor layer.

3. The semiconductor device manufacturing method according to claim 1,
wherein the brittle portions each contain a crystal mixture of GaN and BN, a crystal mixture of GaN and AlN, or a crystal mixture of GaN and InN.

4. The semiconductor device manufacturing method according to claim 3,
wherein the brittle portions each have a superlattice structure.

5. The semiconductor device manufacturing method according to claim 1,
wherein the brittle portions each have a periodic structure in which high-crystallinity layers and low-crystallinity layers are alternately laminated.

6. The semiconductor device manufacturing method according to claim 1,
wherein the brittle portions each have a periodic structure in which high-impurity-concentration layers and low-impurity-concentration layers are alternately laminated.

7. The semiconductor device manufacturing method according to claim 1,
wherein the brittle portions each have a thickness of 10 nm to 100 nm.

* * * * *